(12) United States Patent
Lankhorst et al.

(10) Patent No.: US 8,335,103 B2
(45) Date of Patent: Dec. 18, 2012

(54) INTEGRATED CIRCUIT WITH MEMORY CELLS COMPRISING A PROGRAMMABLE RESISTOR AND METHOD FOR ADDRESSING MEMORY CELLS COMPRISING A PROGRAMMABLE RESISTOR

(75) Inventors: Martijn H. R. Lankhorst, Eindhoven (NL); Franciscus P. Widdershoven, Eindhoven (NL)

(73) Assignee: NXP B.V., Eindhoven (NL)

( * ) Notice: Subject to any disclaimer, the term of this patent is extended or adjusted under 35 U.S.C. 154(b) by 994 days.

(21) Appl. No.: 11/576,459

(22) PCT Filed: Aug. 19, 2005

(86) PCT No.: PCT/IB2005/052730
§ 371 (c)(1),
(2), (4) Date: Jan. 15, 2010

(87) PCT Pub. No.: WO2006/035326
PCT Pub. Date: Apr. 6, 2006

(65) Prior Publication Data
US 2010/0214827 A1 Aug. 26, 2010

(30) Foreign Application Priority Data
Sep. 30, 2004 (EP) .................................... 04104797

(51) Int. Cl.
*G11C 11/00* (2006.01)
(52) U.S. Cl. ......... 365/163; 365/145; 365/148; 365/158
(58) Field of Classification Search .............. 365/145 X, 365/148 X, 158 X, 163 O, 171, 145, 148, 365/158, 163
See application file for complete search history.

(56) References Cited

U.S. PATENT DOCUMENTS

| 5,896,312 | A | 4/1999 | Kozicki et al. |
| 6,314,014 | B1 | 11/2001 | Lowrey et al. |
| 6,944,050 | B2 | 9/2005 | Kang et al. |
| 6,990,005 | B2 * | 1/2006 | Saito ............................. 365/145 |
| 7,206,216 | B2 * | 4/2007 | Osada et al. .................. 365/148 |
| 7,206,217 | B2 * | 4/2007 | Ohtsuka et al. ............... 365/148 |
| 2003/0076708 | A1 | 4/2003 | Hidaka |
| 2004/0130939 | A1 | 7/2004 | Morikawa |
| 2005/0045919 | A1 | 3/2005 | Kaeriyama et al. |
| 2005/0185445 | A1 | 8/2005 | Osada et al. |

FOREIGN PATENT DOCUMENTS

| CN | 1512591 A | 7/2004 |
| EP | 0274828 A | 7/1998 |
| EP | 1326254 A1 | 7/2003 |
| EP | 1376598 A | 1/2004 |

(Continued)

*Primary Examiner* — VanThu Nguyen

(57) ABSTRACT

A module comprises a bus invert encoder (24) for determining whether a set of data bits should be inverted prior to transmission over a communication bus. The bus invert encoder (24) produces a bus invert signal BI which controls a selective inversion means (28), for example a multiplexer. A partial fault detection encoder (32) determines one or more temporary check bits from the set of data bits, substantially in parallel with the bus invert encoder (24). Thus, the one or more temporary check bits are determined based on the assumption that the set of data bits are to be transmitted without inversion from the selective inversion means (28). A logic unit (34) is provided for correcting the one or more temporary check bits, if necessary, based on the bus invert signal produced by the bus invert encoder (24). The module has the e advantage of enabling the temporary check bits to be determined in parallel with the bus invert encoding, thereby reducing latency, with the logic unit being used to correct the check bits, if necessary, prior to transmission over the communication bus.

19 Claims, 8 Drawing Sheets

FOREIGN PATENT DOCUMENTS

| | | | |
|---|---|---|---|
| EP | 1426974 A | 6/2004 |
| EP | 1441361 A | 7/2004 |
| EP | 1463061 A | 9/2004 |
| EP | 1486985 A | 12/2004 |
| EP | 1489623 A | 12/2004 |
| WO | 2004019410 A1 | 3/2004 |
| WO | WO2004025659 A1 | 3/2004 |
| WO | WO2004057618 A2 | 7/2004 |
| WO | WO2004114315 A | 12/2004 |
| WO | WO2005050001 A | 6/2005 |

* cited by examiner

INTEGRATED CIRCUIT WITH MEMORY CELLS COMPRISING A PROGRAMMABLE RESISTOR AND METHOD FOR ADDRESSING MEMORY CELLS COMPRISING A PROGRAMMABLE RESISTOR

The present invention relates to an integrated circuit with memory cells comprising a programmable resistor as well as a method for accessing memory cells comprising a programmable resistor.

New semiconductor memory devices which are based on the use of so-called phase-change materials as data storage mechanism, i.e. phase-change memories, may become the non-volatile memories of the next generation. The phase-change memories explore the reversible changes in the crystal structure for example of chalcogenide alloys.

The phase-change memory typically comprise an array of constituent cells wherein each cell has some phase-change material for storing data. By incorporating the chalcogenide alloy into an integrated circuit such a cell may act as fast switching programmable resistor. In particular, such a phase-change memory cell comprises a series arrangement of a resistor composed of phase-change material and some kind of selection means. The phase-change material is characterized by a low ohmic crystalline state and a high ohmic amorphous state. The amorphous state has the property that above a certain threshold voltage low ohmic filaments are formed. In this way enough power can be dissipated in the SET pulse to switch to the crystalline state.

The change from the crystalline to the amorphous phase of the phase-change material can be programmed with a short high power pulse, i.e. RESET. The change from amorphous to crystalline state is performed by programming the material with a relative longer and lower power pulse, i.e. SET. For more details on programming a phase-change material memory please refer to WO 2004/025659 A1.

The selection means may be implemented as a diode, bipolar transistor or a (N)MOS-transistor. Regarding embedded applications the usage of a NMOS-transistor in series with the programmable phase-change resistor is the preferable option in terms of the fabrication and because it is the most reliable option for embedded applications.

A memory based on an array of NMOS-transistor with programmable resistor according to the prior art is shown in FIG. 11. The drains of the respective transistors are connected via the programmable resistor to the bit-line b1. The gates of the NMOS-transistors are connected to the word-lines w1. The source of the transistor is connected to common ground. Here, an implementation of addressing merely the central cell for a RESET operation by applying $V_{dd}$ to the word-line w1 and the bit-line b1 for the central cell is shown. All other word lines and bit-lines are addressed with zero current. Here, RESET is considered as it requires the maximum power to be delivered to the programmable resistor. Another prior art phase-change memory is shown in EP 1326254 and in WO 2004/057618

A typical memory cell with a programmable phase-change resistance is shown in FIG. 12. The source of the (N)MOS-transistor T is connected to a reference voltage, preferably to common ground, while the drain is connected in series to the programmable resistor R. Accordingly, the transistor conditions may be summarized as follow: The gate-source voltage $V_{GS}$, $V_{GD}$ and $V_{DS}$ are all smaller than $V_{dd}$, respectively, wherein $V_{dd}$ is the maximum voltage over transistor, e.g. the supply voltage.

In FIG. 13 a graph of a simplified NMOS-transistor T is depicted for a case with a maximum voltage and the gate-source voltage $V_{GS}$. Therefore, the optimal power dissipation of a programmable resistor in the memory cell will be:

$$P_{opt} \approx I_m * V_{dd}$$

However the usage of a normal size (N)MOS-transistor may not provide sufficient power per transistor-size, which is to be applied to the programmable phase-change resistor. Accordingly, the size of the (N)MOS-transistors has to be increased in order to deliver the required power.

It is therefore an object of the invention to provide an integrated circuit with memory cells comprising a programmable resistor as well as a method of addressing memory cells comprising a programmable resistor which are capable of increasing the available power which can be delivered to a memory cell.

This object is solved by an integrated circuit according to claim 1 as well as a method of addressing a memory cell according to claim 9.

Therefore, an integrated circuit is provided which comprises a plurality of bit-lines b1 and a plurality of word-lines w1 as well as a plurality of memory cells coupled between a separate bit-line-word-line pair of the plurality of bit-lines b1 and the plurality of word-lines w1 for storing data in the memory cell. Each memory cell consists of a selecting unit and a programmable resistance R. A further addressing line is connected to the memory cell. Therefore, with the provision of the additional addressing line more voltage and more power can be supplied to the memory cell allowing a greater degree of freedom for controlling the memory cell.

According to an aspect of the invention, the programmable resistor is implemented as a programmable phase-change resistor. Therefore, a phase-change memory array can be efficiently realized.

According to an aspect of the invention, the selection unit is implemented as NMOS-transistor. The bit-line line is connected to the source of the NMOS-transistor and the word-line is connected to the gate of the NMOS-transistor. The programmable resistor is connected in series to the drain of the transistor and is further coupled to the further addressing-line. Accordingly, by varying the voltage supplied to the addressing-line, the voltage over the programmable resistor may be controlled.

According to still a further aspect of the invention, the addressing-line is connected in parallel to the word-line and orthogonal to the bit-line.

According to a further aspect of the invention, the further addressing-line is supplied with a voltage larger than $V_{dd}$ and smaller than or equal to $2V_{dd}$ for programming the selected memory cell. Hence, the programmable resistor can be supplied with a greater voltage such that more power can be applied to said selected memory cell.

The invention also relates to a method for addressing a memory cell within an array of memory cells with bit-lines and word-lines. Each memory cell comprises a selecting unit and a programmable resistance. Said memory cell is addressed through a further addressing-line.

It is the basic idea of the invention to increase the potential difference over the programmable phase-change resistor while using selection transistors operating at voltages<$V_{dd}$ by providing an additional action-line a1 in addition to the bit-line b1 and the word-line w1. The addressing of the three lines is performed such that the potential difference over the programmable phase-change resistor is sufficient to perform the phase-change operations. The memory cell according to the prior art can also be implemented with high voltage transistors. However, such transistors occupy a large area and require large insulating gaps between neighboring transistors compared to transistors operating at a low voltage.

These and other aspects of the invention are apparent from and will be elucidated with reference to the embodiment described hereinafter.

Figure 1:
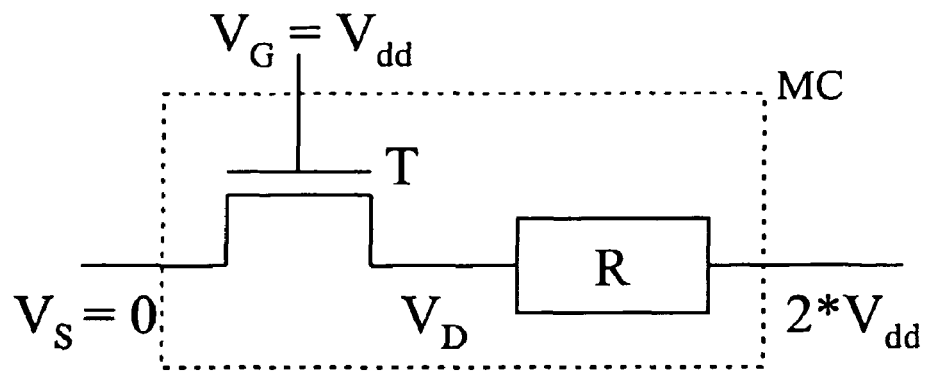
FIG. 1 shows a circuit diagram of a basic phase-change memory cell according to a first embodiment.

FIG. 1 shows the circuit diagram of the basic phase-change memory cell according to the first embodiment. The optimal power dissipation of the programmable resistor in the memory cell may be obtained if the value of the programmable resistor R is selected such that $V_d - V_s$ corresponds to approximately $V_{dd}/3$.
Hence, $$P_{opt} < I_m * V_{dd}$$

$$P_{opt} = 3/4 * I_m * 2/3 * V_{dd} = 1/2 * I_m * V_{dd}$$

$$R_{opt} = (2/3 V_{dd})/(3/4 * I_m) = 8/9 * (V_{dd}/I_m)$$

$$P_{opt} \leq I_m * V_{dd}$$

A programmable phase-change resistant R is connected on its one side to the drain terminal of a NMOS-transistor T and at its other side a voltage of $2*V_{dd}$ is applied to the programmable resistance R. A voltage of $V_{dd}$ is applied to the drain terminal of the NMOS-transistor T while the source terminal is connected to common ground $V_s = 0$.

The value of the resistance R must be designed such that the following equation is met:

$$V_D = 2 * V_{dd} - I_D * R < V_{dd}$$

Figure 2:
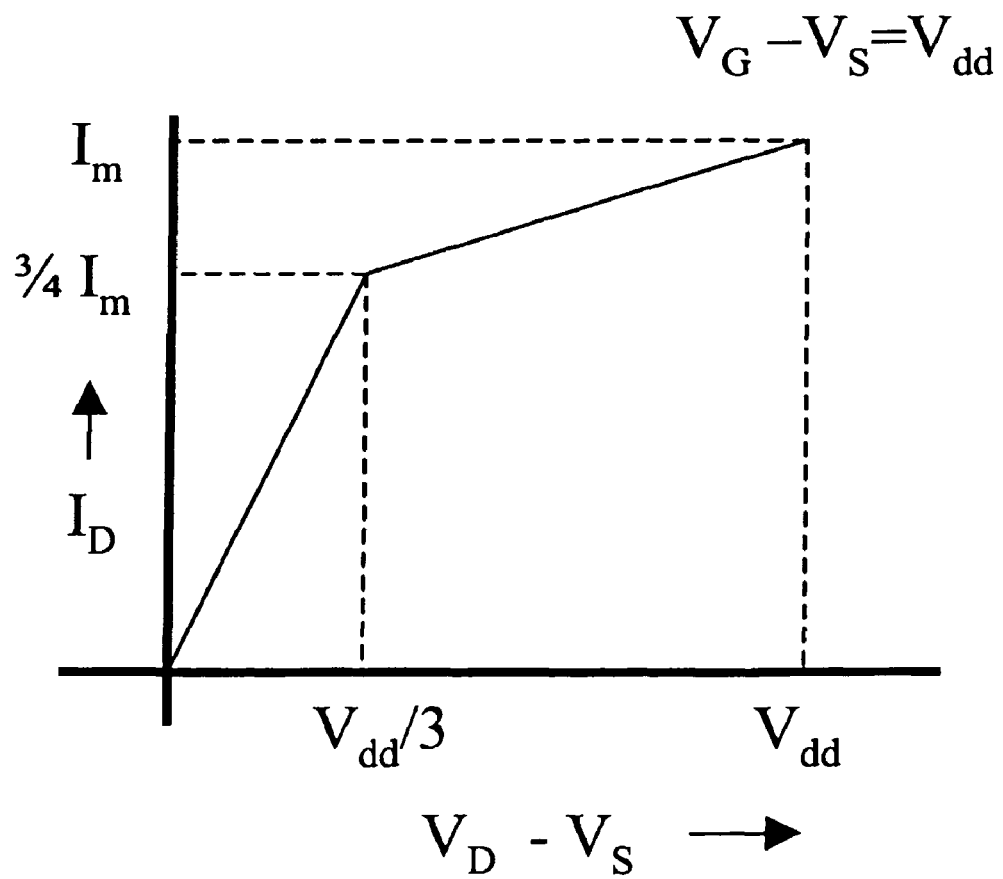
FIG. 2 shows a graph of the simplified model of the NMOS-transistor of FIG. 1.

FIG. 2 shows a graph of the simplified analytical model of the NMOS-transistor of FIG. 1. Here, the gate source voltage $V_{GS}$ equals to $V_{dd}$ (max.). In this case the optimal power dissipation of the resistor R can be achieved if the value of the resistance R is such that $V_D - V_s$ is about $V_{dd}/3$.
Hence, $$P_{opt} = 3/4 * I_m * 5/3 * V_{dd} = 5/4 * I_m * V_{dd}$$

$$R_{opt} = (5/3 V_{dd})/(3/4 * I_m) = 20/9 * (V_{dd}/I_m)$$

Accordingly, a power gain of a factor of 2.5 may be achieved by implementing the concept according to the first embodiment.

Figure 3:
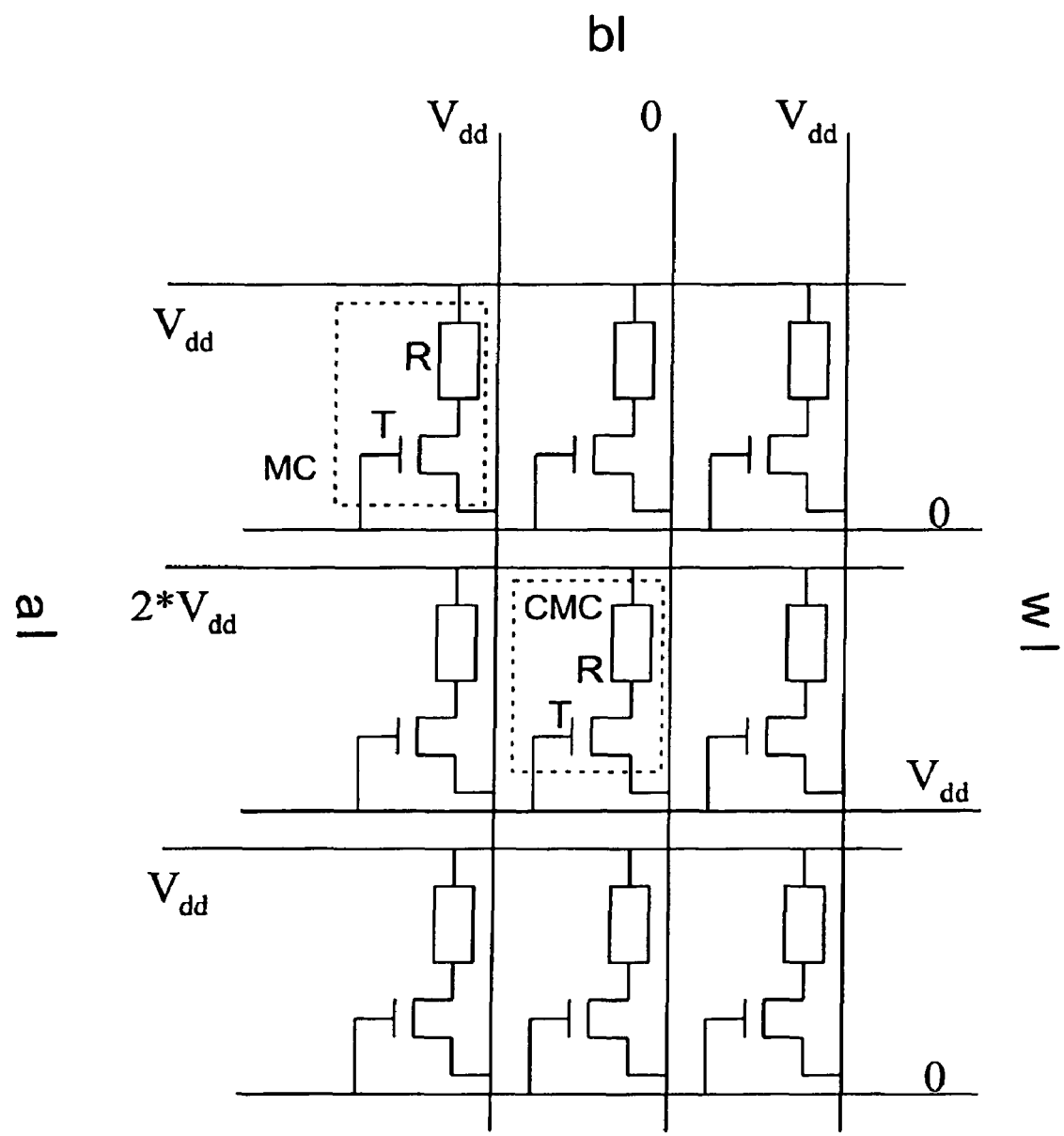
FIG. 3 shows the circuit diagram of an array of memory cells of FIG. 1 according to the first embodiment.

FIG. 3 shows a circuit diagram of an array of phase-change memory cells MC of FIG. 1. Each memory cell MC comprises of a NMOS-transistor T with a programmable phase-change resistor R connected to the drain terminals of the NMOS-transistors T. The gates of the NMOS-transistors are connected to the word-lines w1 and the source thereof is connected to the bit-lines b1. The programmable phase-change resistor R is further connected to an action-line a1, i.e. the drains of the transistor T is connected via the resistor R to the action line a1. The action-line a1 are arranged in parallel with the word-lines w1. Here, the RESET-situation is shown.

In particular, FIG. 3 shows the addressing of the central memory cell CMC within the memory array. All other memory cells MC are not supplied with current. Only the word-line w1 of the central cell CMC is supplied with $V_{dd}$ while the other word-lines are supplied with zero voltage. The bit-line b1 of the central cell CMC is supplied with zero voltage while the bit-lines of the other cells are supplied with $V_{dd}$. The action-line a1 associated to the central cell is supplied with $2*V_{dd}$ while the other two action-lines at are supplied with $V_{dd}$.

All necessary transistor conditions will be maintained as long as the resistor comprises the values as shown with regard to FIG. 2. Accordingly, the gate source voltage $V_{GS}$, the gate drain voltage $V_{GD}$ and the drain source voltage $V_{DS}$ are smaller than Vdd, respectively.

Accordingly, an array of memory cells MC is shown which comprise NMOS-transistors operating with a voltage $\leq V_{dd}$, to provide a higher potential difference over the programmable phase-change resistor R, and which comprise an additional action-line a1.

Figure 4:
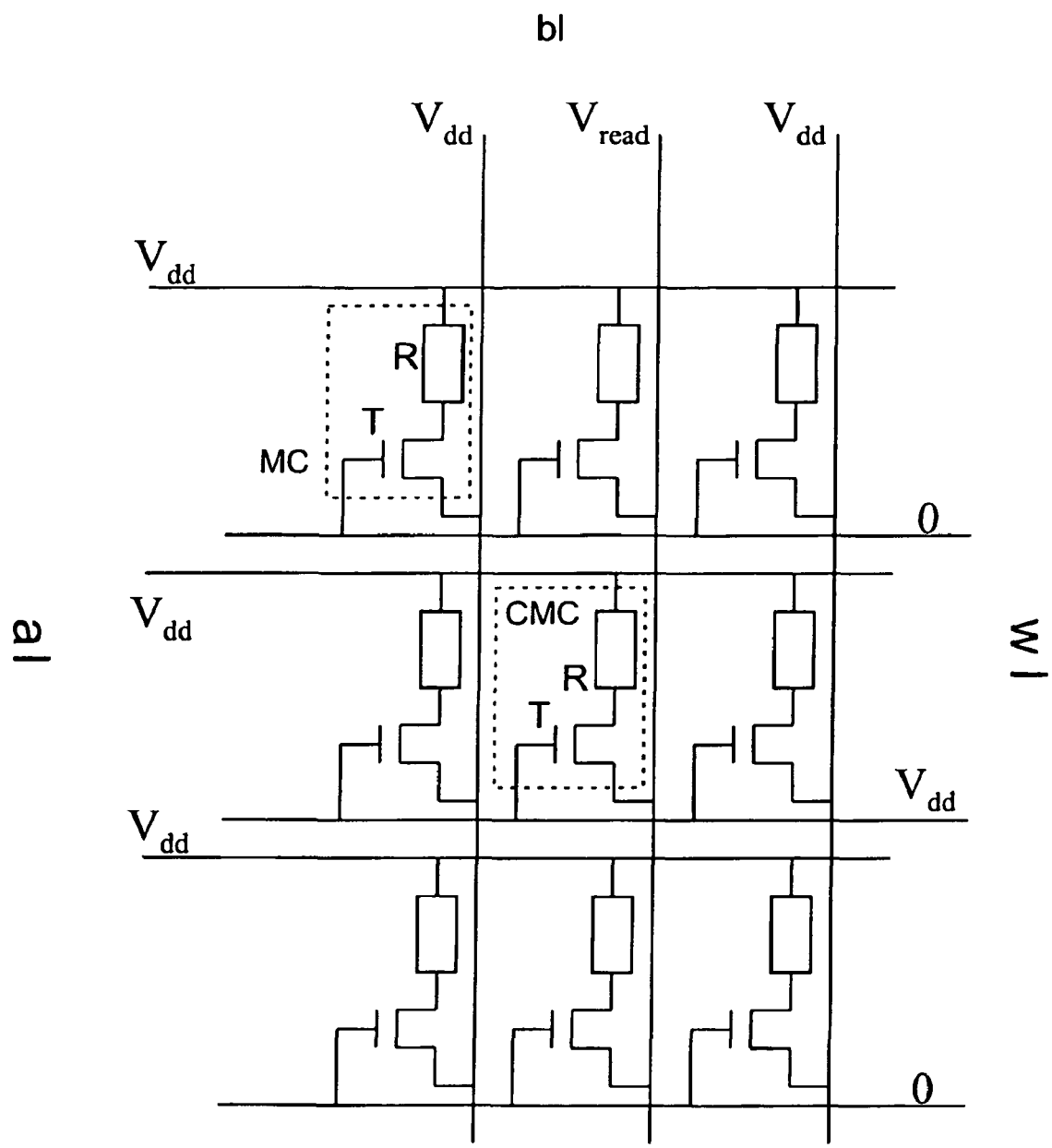
FIG. 4 shows a circuit diagram of an array of memory cells according to a second embodiment.

FIG. 4 shows a circuit diagram of an array of phase-change memory cells MC according to a second embodiment. The basic arrangement of the array of memory cells according to the second embodiment correspond to the arrangement of the first embodiment. A reading operation of a phase-change memory cells can be performed by supplying $V_{dd}$ to all action-lines a1 and by applying a read potential of $0 < V_{READ} < (V_{dd} - V_T)$ to one or more of the bit-lines. As usual, the bit-lines b1 are connected to typical sense amplifies for sensing. $V_T$ is the threshold value of the transistor.

Here, the word-line w1 associated to the central cell CMC is supplied with $V_{dd}$ while the other two word-lines w1 are supplied with zero voltage. All action-lines a1 are each supplied with $V_{dd}$ while only the bit-line b1 associated to the central cell is supplied with $V_{READ}$. The other bit-lines b1 are supplied with $V_{dd}$. Parallel reading along the same word-line is also possible.

The programming operation is performed by setting the potential of the bit-line b1 to zero for the RESET operation or by setting the potential to $V_{SET}$, i.e. the SET operation. The voltage of the respective action-line a1 is set to $2*V_{dd}$. Please note that several bit-lines b1 may be programmed in parallel in this way. Alternatively, a SET operation can be performed by using a third potential on the selected action-line. Such potential should be in the range of $V_{dd}$ to $2V_{dd}$. Here, it is possible to program multiple cells along the selected action-line (and word-line) in parallel.

Figure 5:
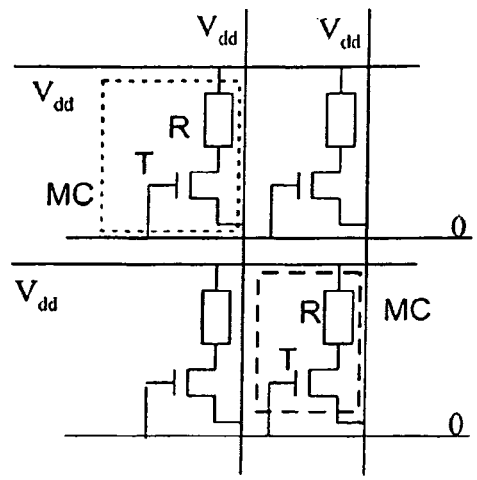
FIG. 5 shows a circuit diagram of an array of memory cells according to a third embodiment.

FIG. 5 to FIG. 8 show circuit diagrams of an array of phase-change memory cells MC according to a third embodiment in order to illustrate the programming thereof. Here, the bottom right cell MCI is selected. FIG. 5 shows a circuit diagram of an array of for phase-change memory cells in a reference state, i.e. the bit-lines as well as the action-lines at are supplied with $V_{dd}$ respectively. The word-lines w1 are supplied with zero voltage.

Figure 6:
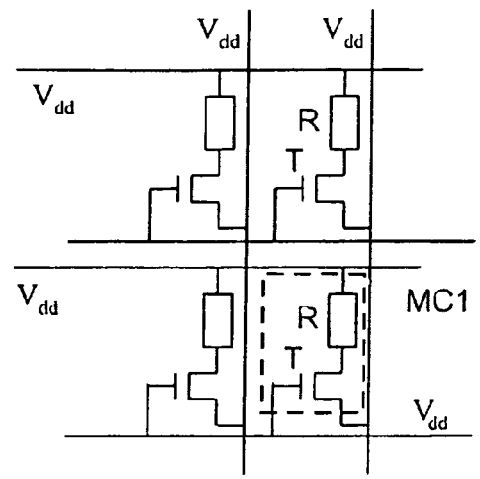
FIG. 6-8 shows a circuit diagram of an array of phase-change memory sells for illustrating the programming of the array, respectively.
Figure 7:
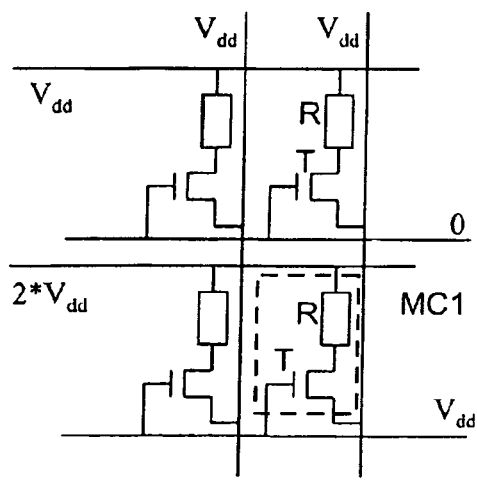
Figure 8:
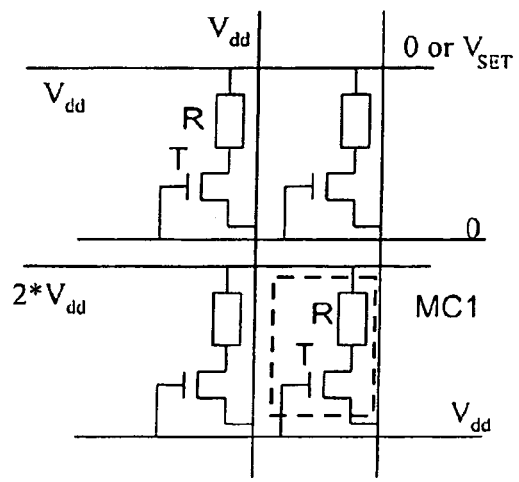

FIG. 6 shows the arrangement of FIG. 5 with an adjusted word-line w1, i.e. the second word-line w1 is now supplied with $V_{dd}$ instead of zero voltage. FIG. 7 shows the array of FIG. 6 with an adjusted action-line a1, i.e. the second action-line a1 is supplied with a voltage of $2V_{dd}$. FIG. 8 show the array of FIG. 7 with a selected bit-line b1, i.e. the second bit-line b1 is either zero voltage or $V_{SET}$.

Accordingly, the programming sequence starts by selecting the word-line w1 and thereafter the action-line a1. The word-line w1 must be selected firstly, i.e. before the action-line a1, in order to prevent a high potential difference of larger than $V_{dd}$ over the NMOS-transistor T. Finally, the bit-line is selected such that a current will only flow in a state as shown in FIG. 8. A parallel programming is also possible and may be performed by selecting multiple bit-lines in parallel.

Figure 9:
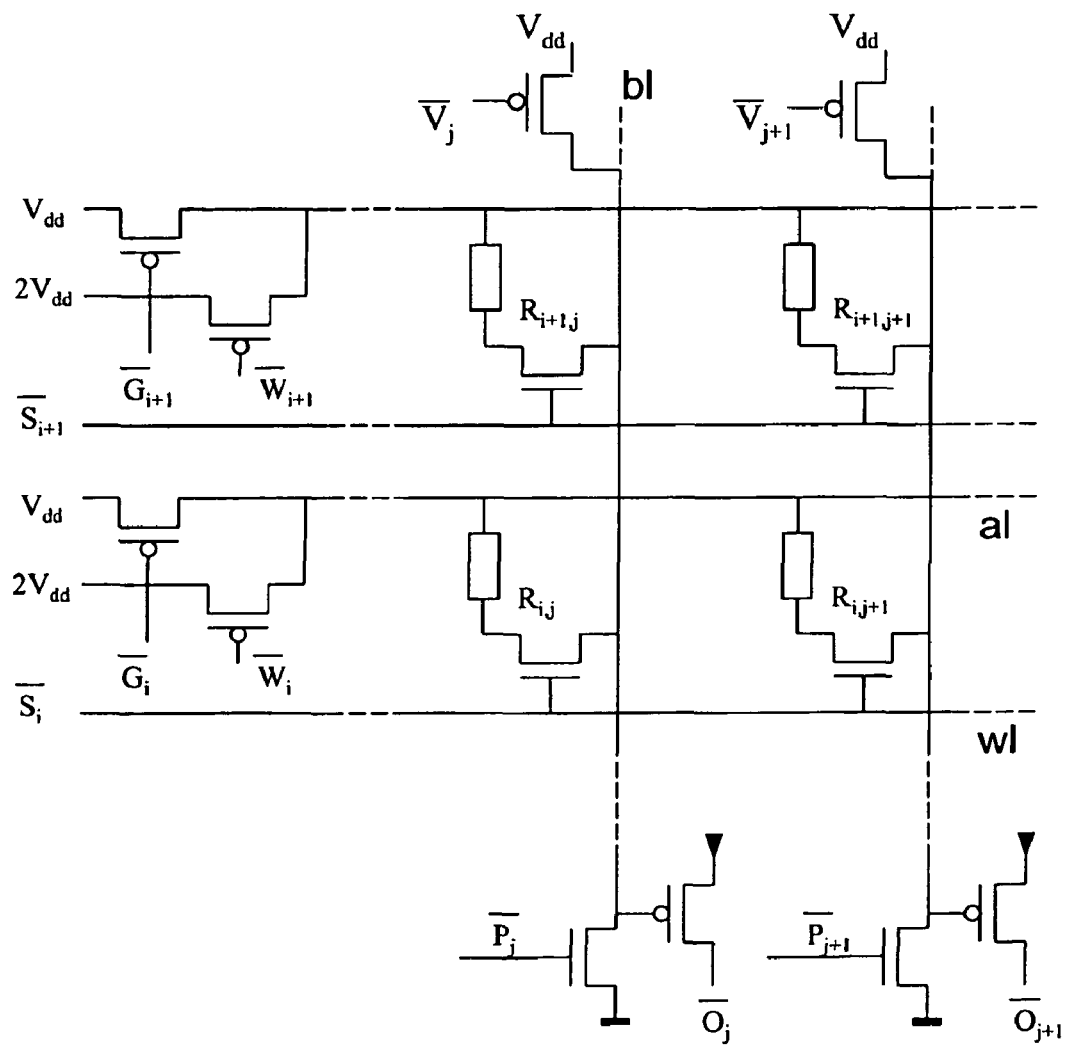
FIG. 9 shows a circuit diagram of an array of phase-change memory cells according to a fourth embodiment.

FIG. 9 shows a circuit diagram of an array of phase-change memory cells according to a fourth embodiment based on the first, second or third embodiment. Here, the RESET, the SET and the READ operation are performed by changing the voltage on the bit-line. The reading circuitry is also connected to the bit-line.

The programming of a selected cell is performed according to the following tables:

| wl/al | $S_i$ | $G_i$ | $W_i$ |
|---|---|---|---|
| WRITE | $V_{dd}$ | $2V_{dd}$ | 0 |
| READ | $V_{dd}$ | 0 | $2V_{dd}$ |
| Not selected | 0 | 0 | $2V_{dd}$ |

| bl | $V_j$ | $P_j$ |
|---|---|---|
| RESET | $V_{dd}$ | $V_{dd}$ |
| SET | $V_{dd}$ | $V_1$ |
| READ | $V_{dd}$ | $V_2$ |
| Not selected | 0 | 0 |

Here, $0<V_1<V_{dd}$, and $0<V_2<V_{dd}$. In this embodiment the SET and RESET operation is controlled via the voltage of the bit-line.

Figure 10:
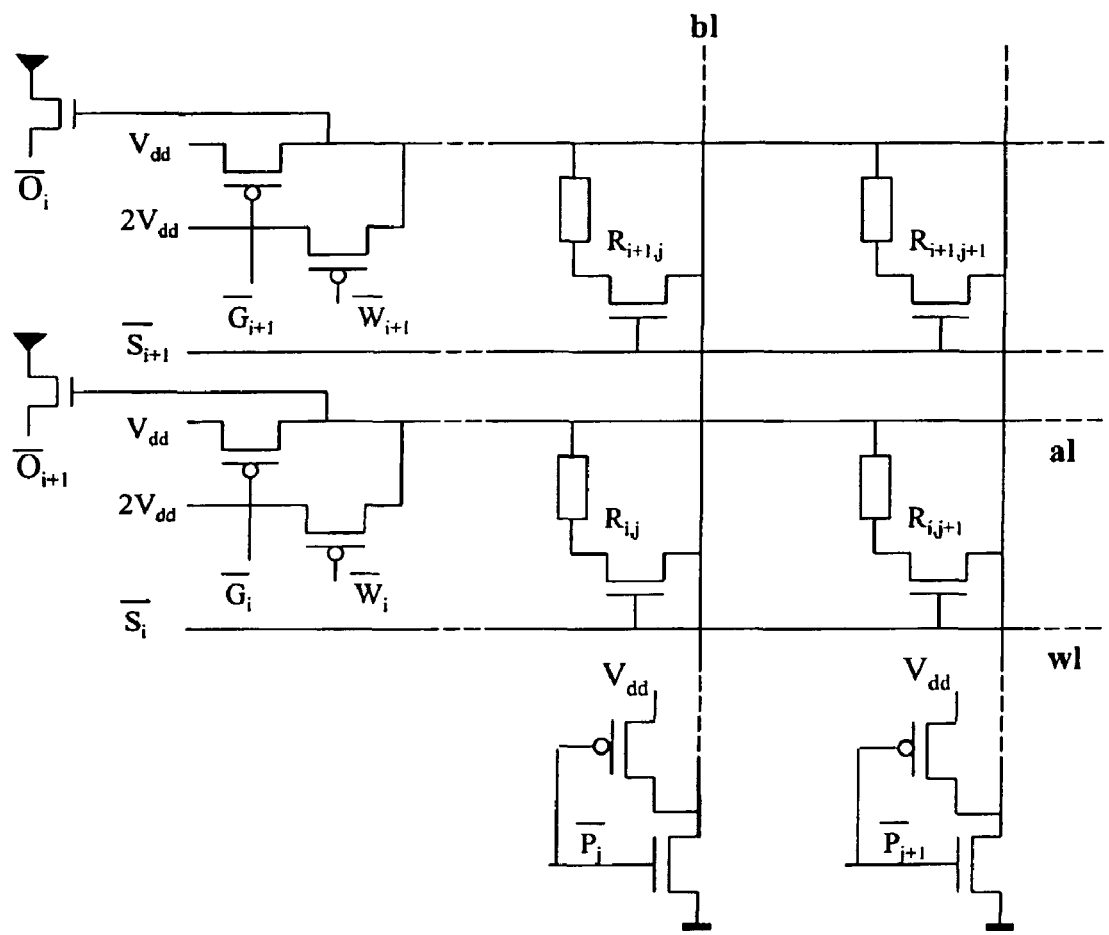
FIG. 10 shows a circuit diagram of an array of phase-change memory cells according to a fifth embodiment.
Figure 11:
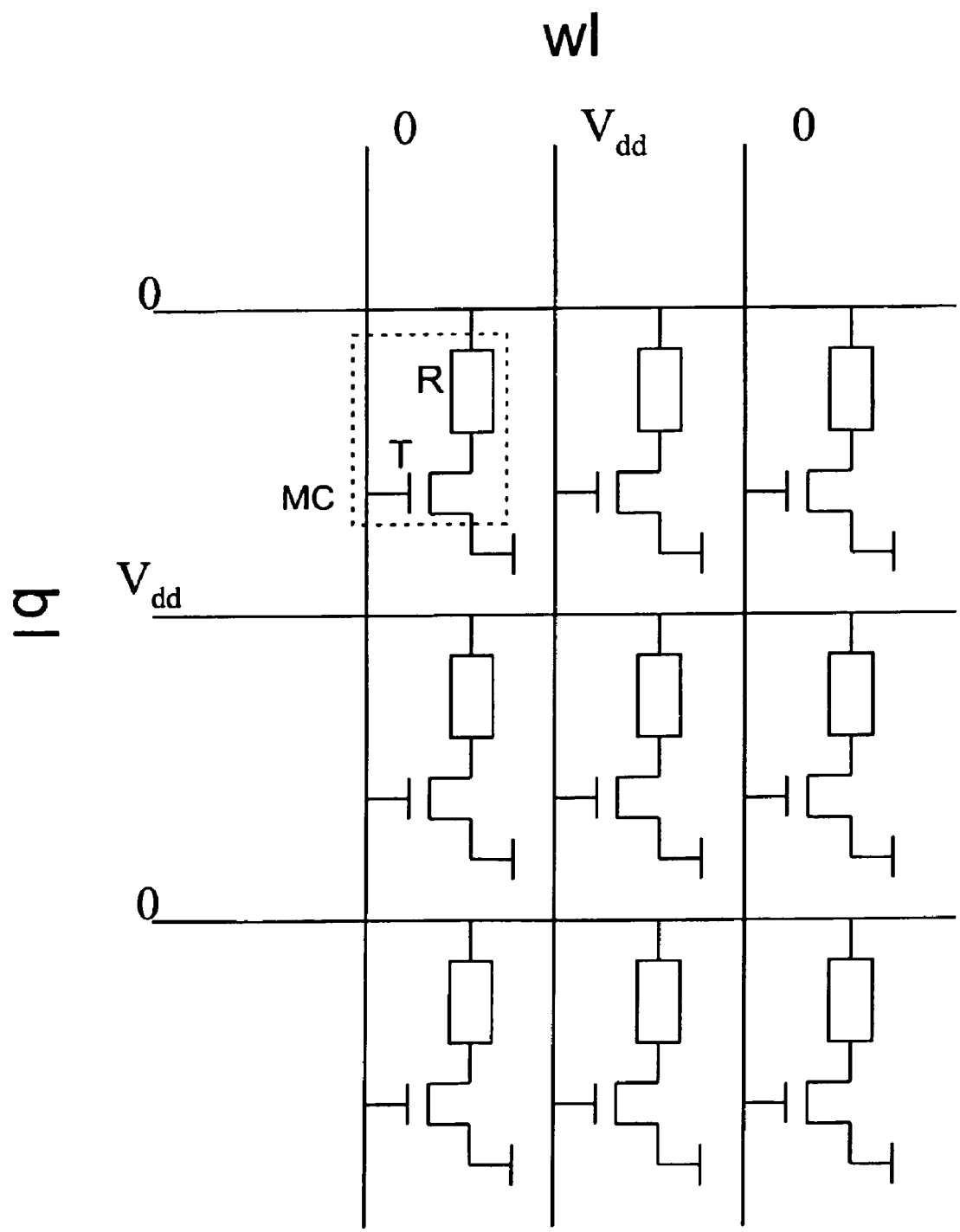
FIG. 11 shows a circuit diagram of an array of phase-change memory cells according to the prior art.
Figure 12:
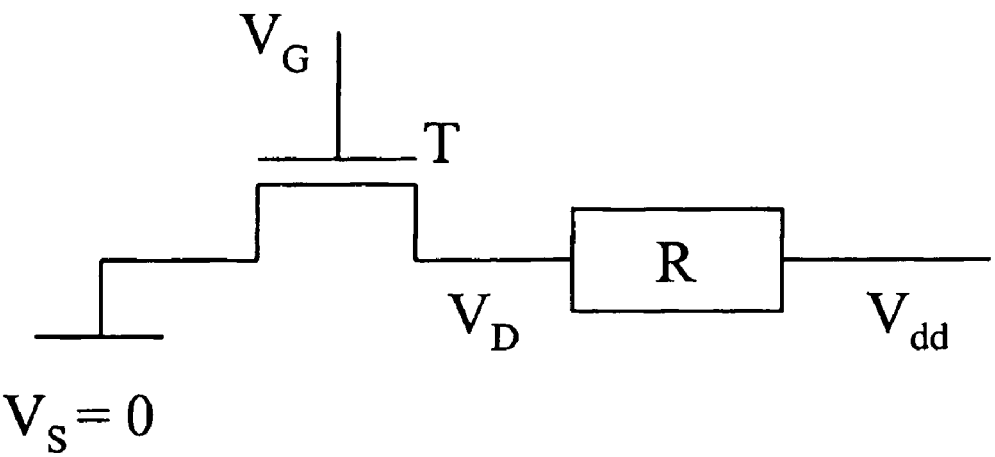
FIG. 12 shows a circuit diagram of a phase-change memory cell according to the prior art.
Figure 13:
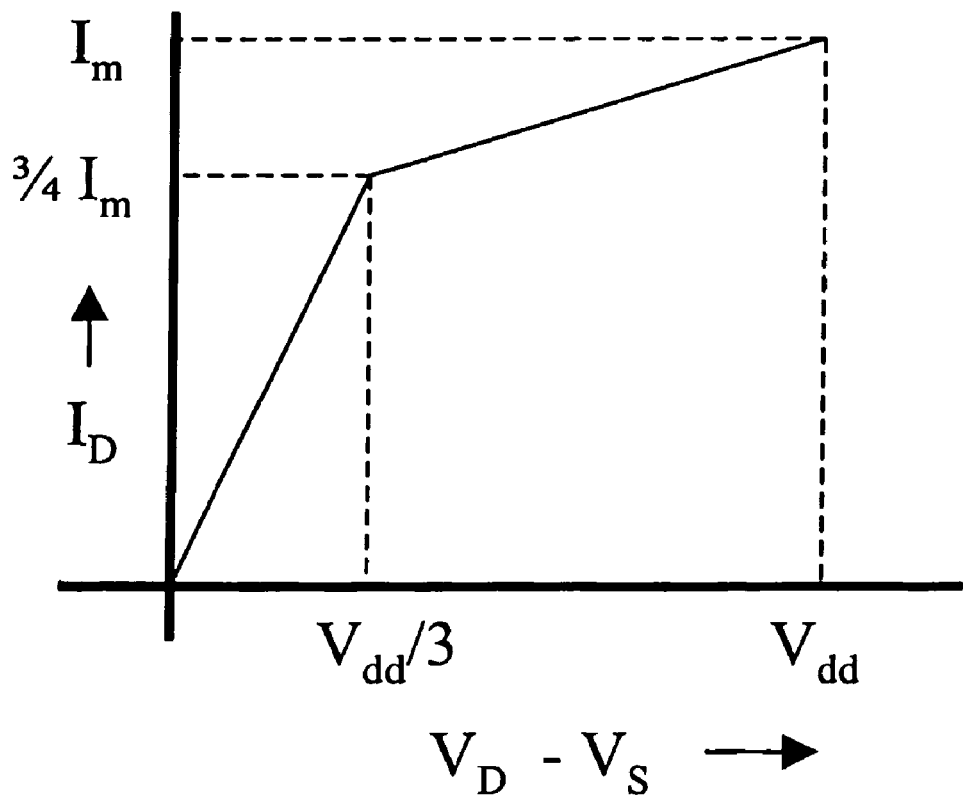
FIG. 13 shows a graph of a simplified NMOS-transistor model according to FIG. 12.

FIG. 10 shows a circuit diagram of an array of phase-change memory cells according to a fifth embodiment based on the first, second or third embodiment. Here, the RESET and the SET operation is performed on the action-line. As the action-line is in parallel to the word-line, no parallel programming or reading is possible for this embodiment.

The programming of a selected cell is performed according to the following tables:

| wl/al | $S_i$ | $G_i$ | $W_i$ | $P_j$ |
|---|---|---|---|---|
| RESET | $V_{dd}$ | $2V_{dd}$ | 0 | $V_{dd}$ |
| SET | $V_{dd}$ | $2V_{dd}$ | $V_1$ | $V_{dd}$ |
| READ | $V_{dd}$ | 0 | $2V_{dd}$ | $V_{dd}$ |
| Not selected | 0 | 0 | $2V_{dd}$ | 0 |

Here, $0<V_1<2V_{dd}-V_T$. In this embodiment the SET and RESET operation is controlled via the voltage of the action-line.

Alternatively, to the fourth and fifth embodiment the voltage of the bit-line b1 as well as the voltage on the action-line are changed to perform the SET and RESET operation. However, this will lead to an increase in the signaling as compared to the fourth and fifth embodiment.

It should be noted that for all above embodiments the action-lines a1 are arranged in parallel to the word-lines w1 and orthogonal to the bit-lines.

Although in the above embodiments the programmable resistor is described as a phase-change resistor, also other programmable resistor memories may be implemented with the above principles. Such memory cells may comprise programmable metallization cells as described in U.S. Pat. No. 5,896,312 or by ferro-electric programmable resistors as described in WO 2004/019410.

Summarizing it can be said, that by introducing a third line, namely the action-line which is connected via the programmable phase-change resistor to the drain-terminal of the NMOS-transistors in combination with an improved addressing technique, a factor of 2.5 more power can be delivered to the phase-change resistor in the phase-change memory cell without increasing the size of the NMOS-transistor. The selected cell is supplied with a voltage which is higher than $V_{dd}$, preferably $2V_{dd}$, wherein $V_{dd}$ is the maximum allowable source-drain voltage. Even though a higher voltage is applied to the selected cell the voltage over the selection element will remain below $V_{dd}$ because of the voltage drop over the programmable phase-change resistor connected to the drain of the transistor. The current through the other non-conducting, non-selected phase-change memory cells is maintained at zero, while the voltage over the programmable resistor is increased with reference to the prior art programmable resistor.

It should be noted that the above-mentioned embodiments illustrate rather than limit the invention, and that those skilled in the art will be able to design many alternative embodiments without departing from the scope of the appended claims. In the claims, any reference signs placed between parentheses shall not be construed as limiting the claim. The word "comprising" does not exclude the presence of elements or steps other than those listed in a claim. The word "a" or "an" preceding an element does not exclude the presence of a plurality of such elements. In the device claim enumerating several means, several of these means can be embodied by one and the same item of hardware. The mere fact that certain measures are recited in mutually different dependent claims does not indicate that a combination of these measures cannot be used to advantage.

Furthermore, any reference signs in the claims shall not be construed as limiting the scope of the claims.

The invention claimed is:

1. Integrated circuit, comprising
a plurality of bit-lines and a plurality of word-lines as well as a plurality of memory cells coupled between a separate bit-line/word-line pair of the plurality of bit-lines and word-lines for storing data in one of the plurality of memory cells,
wherein each memory cell includes
a selecting unit,
a programmable resistor, and
a further addressing-line connected to the memory cell, wherein said selecting unit is implemented as a NMOS-transistor, with its gate connected to the respective word-line, and with its source connected to the respective bit-line,
wherein the programmable resistor is connected in series to the drain of the transistor, and is further coupled to the further addressing-line, wherein the word-line is selected before the further addressing-line, and wherein a voltage is applied to the gate of the transistor of the selected memory cell, and wherein said further addressing-line is supplied with a voltage that is larger than said voltage applied to the gate of the transistor of the selected memory cell in order to program a selected memory cell.

2. Integrated circuit according to claim 1, wherein said programmable resistor is a programmable phase change resistor.

3. Integrated circuit according to claim 1, wherein the further addressing-line is connected in parallel to the word-line and orthogonal to the bit-line.

4. Integrated circuit according to claim 1, wherein a voltage $V_{dd}$ is applied to the gate of the transistor of the selected memory cell, and wherein said further addressing-line is supplied with a voltage larger than $V_{dd}$ and smaller than or equal to $2V_{dd}$ in order to program (SET, RESET) a selected memory cell.

5. Integrated circuit according to claim 1, wherein all further addressing-lines are supplied with a first voltage while a second voltage is supplied to at least one bit-line for reading a memory cell, and wherein the first voltage is higher than the second voltage.

6. Integrated circuit according to claim 1, wherein the word-line and the further addressing-line are selected before the bit-line.

7. Method for addressing a memory cell within an array of memory cells with bit-lines and word-lines, wherein each memory cell comprises a selecting unit and a programmable resistance, and a further addressing-line connected to the memory cell, wherein said selecting unit is implemented as a NMOS-transistor, with its gate connected to the respective bit-line, wherein the programmable resistance is connected in series to the drain of the transistor, and is further coupled to the further addressing-line, the method comprising the steps of:
addressing said memory cell through the further addressing-line,
wherein the word-line is selected before the further addressing-line,
applying a voltage to the gate of the transistor of the selected memory cell, and supplying the further addressing-line with a voltage that is larger than said voltage applied to the gate of the transistor of the selected memory cell in order to program a selected memory cell.

8. The method of claim 7, wherein said programmable resistance is a programmable phase change resistor and addressing said memory cell includes addressing said memory cell via the programmable phase change resistor.

9. The method of claim 7, wherein the further addressing-line is connected in parallel to the word-line and orthogonal to the bit-line.

10. The method of claim 7, further including applying a voltage $V_{dd}$ to the gate of the transistor of the selected memory cell, supplying said further addressing-line with a voltage larger than $V_{dd}$ and smaller than or equal to $2V_{dd}$ to program the selected memory cell.

11. The method of claim 7, further including supplying all further addressing-lines with a first voltage while supplying a second voltage to at least one bit-line for reading a memory cell, wherein the first voltage is higher than the second voltage.

12. The method of claim 7, further including selecting the word-line and the further addressing-line before the bit-line.

13. An apparatus comprising:
a selecting unit including a transistor having its gate and its source respectively connected to a word-line and to a bit-line; and
a programmable resistive circuit connected in series between the drain of the transistor and an address-line; and
wherein the resistive circuit is configured and arranged for selection by the word-line before the address-line, while the address-line is supplied with a first voltage and a second voltage is supplied to the bit-line for reading a memory state, and wherein the first voltage is higher than the second voltage, and
the resistive circuit being configured and arranged to program to a resistive state in response to the first voltage being higher than a voltage on the word-line and applied to the gate.

14. The apparatus of claim 13, wherein the selecting unit and the programmable resistive circuit are part of a memory cell, and the apparatus is configured and arranged to apply a voltage $V_{dd}$ to the gate of the transistor a voltage larger than $V_{dd}$ and smaller than or equal to $2V_{dd}$ to the address-line to program the memory cell.

15. The apparatus of claim 13, wherein the selecting unit and the programmable resistive circuit are part of a memory cell, further including a plurality of such memory cells coupled between one of a plurality of bit-lines and one of a plurality of word-lines, the programmable resistive circuit in each memory cell connected to one of a plurality of address-lines, the apparatus being configured and arranged to, for each memory cell, apply a first voltage to the address-line while applying a second voltage to the bit-line connected to the memory cell for reading a memory cell, the first voltage being higher than the second voltage.

16. The integrated circuit of claim 1, wherein the programmable resistor is directly connected to the drain of the transistor and configured and arranged to store the data via a resistance state of the programmable resistor.

17. The integrated circuit of claim 16, wherein the memory cell consists of the NMOS-transistor, the programmable resistor and the further addressing line.

18. The method of claim 7, wherein the programmable resistance is directly connected to the drain of the NMOS-transistor, wherein addressing said memory cell includes accessing data in the memory cell based on a resistance state of the programmable resistor.

19. The integrated circuit of claim 13, wherein the programmable resistive circuit is
directly connected to a drain of the transistor and to the address-line, and
configured and arranged to store the data via a resistance state of the programmable resistive circuit, and to provide an output corresponding to the resistance state in response to the first voltage being applied via the address line and the second voltage being supplied to the bit-line.

* * * * *